US012608291B2

(12) United States Patent
Törmänen et al.

(10) Patent No.: US 12,608,291 B2
(45) Date of Patent: Apr. 21, 2026

(54) COMPUTER-IMPLEMENTED METHOD FOR PERFORMING A SYSTEM ASSESSMENT

(71) Applicant: Volvo Car Corporation, Gothenburg (SE)

(72) Inventors: Mikael Törmänen, Gothenburg (SE); Anders Hägglund, Gothenburg (SE); Johannes Emilsson, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 438 days.

(21) Appl. No.: 17/588,459

(22) Filed: Jan. 31, 2022

(65) Prior Publication Data

US 2023/0244587 A1 Aug. 3, 2023

(51) Int. Cl.
| | |
|---|---|
| *G06F 11/263* | (2006.01) |
| *G06F 11/34* | (2006.01) |
| *G06F 11/3668* | (2025.01) |
| *G06F 30/20* | (2020.01) |

(52) U.S. Cl.
CPC ........ *G06F 11/263* (2013.01); *G06F 11/3428* (2013.01); *G06F 11/3684* (2013.01); *G06F 30/20* (2020.01)

(58) Field of Classification Search
CPC .............. G06F 11/263; G06F 11/3428; G06F 11/3684; G06F 30/20
See application file for complete search history.

(56) References Cited

U.S. PATENT DOCUMENTS

| | | | | |
|---|---|---|---|---|
| 9,111,030 B1 * | 8/2015 | Dunn | ................ | G06F 16/24575 |
| 2019/0155256 A1 * | 5/2019 | Stichling | ........... | G05B 19/4155 |
| 2020/0364132 A1 * | 11/2020 | Underseth | ........... | G06F 11/3664 |
| 2022/0207208 A1 * | 6/2022 | Shen | ....................... | G06F 30/20 |

FOREIGN PATENT DOCUMENTS

| | | | | | |
|---|---|---|---|---|---|
| CN | 105718371 A | * | 6/2016 | .......... | G06F 11/3672 |
| CN | 105808770 A | * | 7/2016 | .......... | G06F 16/122 |
| CN | 107665171 A | * | 2/2018 | .......... | G06F 11/3644 |
| CN | 111797018 A | * | 10/2020 | | |

* cited by examiner

*Primary Examiner* — John C Kuan

(74) *Attorney, Agent, or Firm* — Clements Bernard Walker; Christopher L. Bernard

(57) ABSTRACT

The present disclosure relates to a computer-implemented method for performing a system assessment, a computer program element for performing a system assessment, a computer storage media and a system comprising the computer storage media. The computer-implemented method comprises collecting a plurality of specification files in a database, classifying each specification file based on a specification to be applied in a test environment, referencing at least one specification file necessary to build an assessment environment in a first information layer of the simulation, and building the assessment environment based on the specification file referenced in the first information layer.

19 Claims, 2 Drawing Sheets

10: first information layer
11: work order
20: second information layer
21: specification file
30: third information layer
31: data set
100: information hierarchy

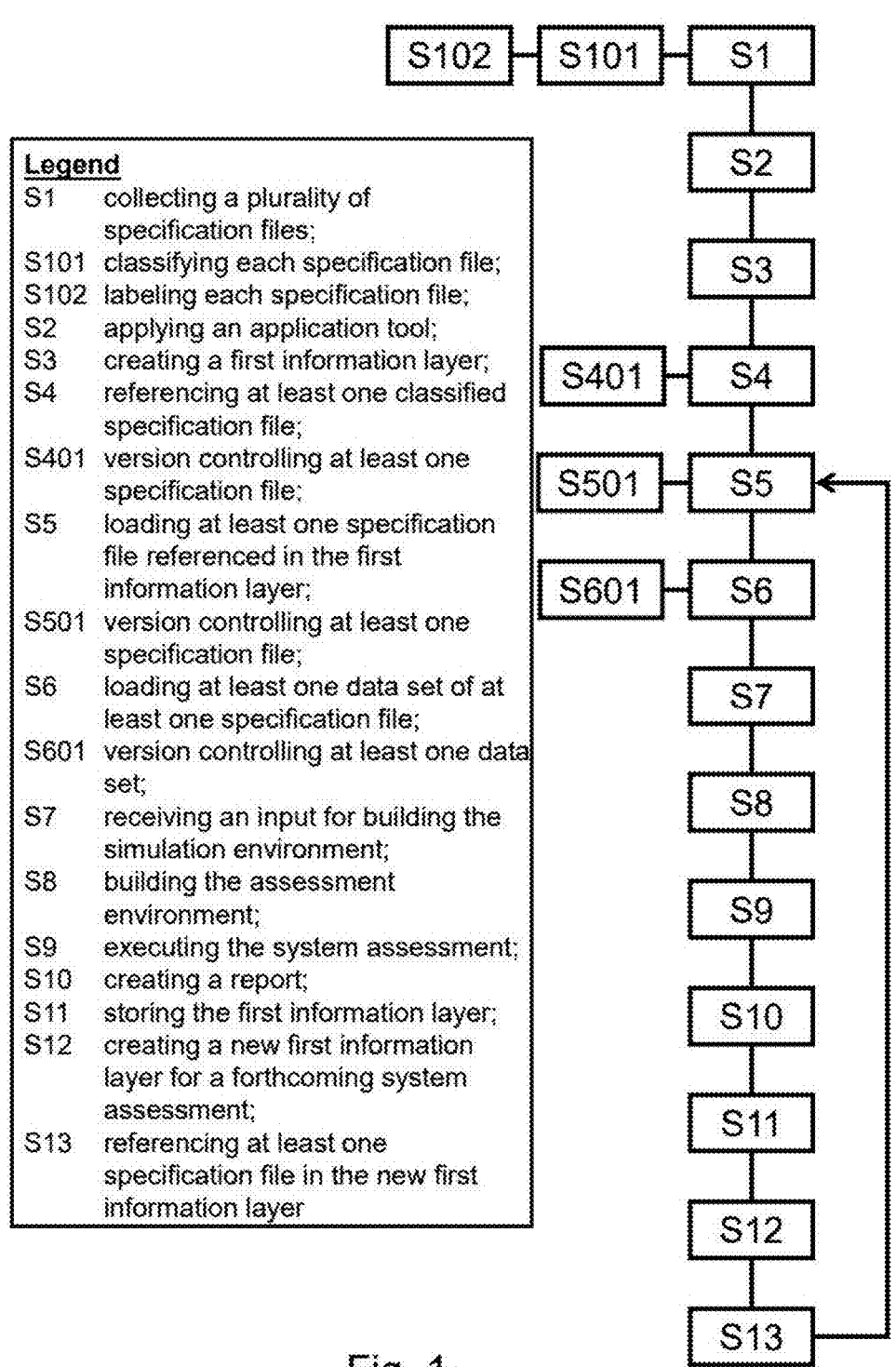

Legend

S1 collecting a plurality of specification files;

S101 classifying each specification file;

S102 labeling each specification file;

S2 applying an application tool;

S3 creating a first information layer;

S4 referencing at least one classified specification file;

S401 version controlling at least one specification file;

S5 loading at least one specification file referenced in the first information layer;

S501 version controlling at least one specification file;

S6 loading at least one data set of at least one specification file;

S601 version controlling at least one data set;

S7 receiving an input for building the simulation environment;

S8 building the assessment environment;

S9 executing the system assessment;

S10 creating a report;

S11 storing the first information layer;

S12 creating a new first information layer for a forthcoming system assessment;

S13 referencing at least one specification file in the new first information layer

Fig. 1

COMPUTER-IMPLEMENTED METHOD FOR PERFORMING A SYSTEM ASSESSMENT

TECHNICAL FIELD

The present disclosure relates to a computer-implemented method for performing a system assessment, a computer program element for performing a system assessment, a computer storage media and a computer system comprising such computer storage media.

BACKGROUND ART

In engineering, computational analysis is carried out for a purpose of predicting performance or property of a technical system, which typically depends on many aspects such as an exact configuration of each subsystem of the technical system, different measurements to record during or after a simulation, precision required by the solver, initial and environmental conditions, and a precise load-case the system. This may be reflected a set-up or a configuration of the simulation.

Practically, the computational analysis requires setting up a numerical model of the technical system, populating it with suitable parameters, subjecting it to intended initial and boundary conditions, choosing a suitable solver system, deciding a hardware and evaluating results. This means, each step of the simulation requires input or configuration data and decisions. Traditionally, this information, i.e. configuration data has been collected from wherever it originates, and inserted into a context of the simulation, and the simulation is carried out. In case a subsequent analysis is requested, the corresponding entities need to be altered, and the simulation is to be repeated.

There are simulation systems, which allow for a more modular approach of the subsystems, where a part of the configuration can be altered without changing entire data set. These systems are tailored for a specific simulation domain, and generally split the configuration in parts that more or less match different physical domains.

SUMMARY

Hence, there may be a need to provide an improved method for preparing and executing a system assessment, which may optimize a utilization of a wide variety of data.

The problem is at least partially solved or alleviated by the subject matter of the independent claims of the present disclosure, wherein further examples are incorporated in the dependent claims. It should be noted that the aspects of the disclosure described in the following apply to the computer-implemented method for performing a system assessment, the computer program element for performing a system assessment, the computer storage media and the computer system comprising such computer storage media.

According to the present disclosure, a computer-implemented method for performing a system assessment is presented. The computer-implemented method comprises collecting a plurality of specification files, classifying each specification file based on a specification to be applied in a physical test environment, referencing at least one classified specification file necessary to build an assessment environment in a first information layer of the simulation, and building the assessment environment based on at least one of the specification files referenced in the first information layer.

The computer-implemented method according to the present disclosure allows an establishment of a standardized set of specification files each defining specifications such as a particular aspect of analysis including environment, system configuration, sensor technology, test sequence, use cases, post-processing, reporting, experiment set-up, etc.

Conventional simulation tools utilize generally monolithic data set for configuring and executing a simulation, which is often stored as a single data file containing entire information. A different analysis may, thus, require another set of data, which may differ only in few modified parts. The unmodified parts of the new data set carry duplicate information without reference to each other between the contexts used. Apart from occupying more space, the duplicate information may not be separately extracted from the monolith data set, therefore it is hard to keep up to date. After some time, this can lead to a large number of variations of the monolith data set.

In contrast, the standardized set of specification files may be generic, and its logical partitioning may be based on the physical test environment. This aspect-oriented approach may enable a reuse and sharing of relevant specifications across domains and environments by means of standardized data sets. Thus, the information provided by the specifications may be compatible with different simulation tools and serve as a common information source.

To understand or predict a technical object or a technical system, computational analysis may be performed. Such assessment or simulation may be based on information describing the system to be analyzed and its environment. For instance, the information may comprise geometrical parameters and/or non-geometrical parameters. Accordingly, various specification files comprising a plurality of data sets based on arbitrary design information may be generated and stored in a database. The database may be a general and/or external database located in a storage medium, which may be connected to a computing device performing the system assessment directly or over a network.

Generally, the way of working with the computational analysis may be not mirroring the ways of working in the physical test environment. Typical computer aided engineering tools are often model-oriented. In the model-oriented approach, a mathematical model and associated solver have been in focus over the years. Further, monolithic data architectures, in which all data operations can be carried out from and to a single, centralized data platform, may be thereby defined by the model-oriented specifications.

However, by categorizing the collected specification files with respect to the real test environment, a quick access and better understanding of each specification file may be achieved. Each categorized specification file may be individually selected for preparing the assessment environment. In other words, the standardized set of specification files may act as a universal input source across domains and environments enabling a collaboration between different assessment environments, for example in multi-disciplinary design optimization.

Once the assessment environment, i.e. simulation environment has been designed, for instance by an engineer, at least one, preferably several specification files may be indicated as necessary information for building the assessment environment. Specifically, one or more specification files may be referenced in the first information layer of the assessment to build the assessment environment for executing the simulation.

The specification files necessary to build the assessment environment may be provided by means of several information layers. For instance, the first information layer of the assessment may be configured to provide a work order comprising a package of one or more specification files. In other words, the first information layer may comprise a list of one or more specification files to be modulated in form of a package. However, the first information layer or such a package may not comprise any detailed specification data set yet.

The first information layer may be stored in the storage medium and/or in the database and reloaded if required. The database for storing the first information layer may be the general and/or external database, in which the plurality of specification files are collected, and/or an application database provided by or directly linked to an application tool. Since the first information layer may comprise only the list of one or more specification files, a size of the first information layer may be marginal, which may not require a huge data space of the storage medium. Accordingly, a particular assessment environment defined in the first information layer may be easily rebuilt anytime.

The application tool for performing the system assessment may have an access to the first information layer and build the assessment environment based on one or more specification files referenced in the first information layer. Accordingly, the application tool may not need to access entire monolithic data set for configuring and executing the simulation, which may improve process efficiency and reliability.

In an example, the method further comprises loading at least one specification file referenced in the first information layer in a second information layer of the assessment. The information provided to perform the system assessment may be constituted in a hierarchy. The first information layer of the assessment may be laid at a top of the information hierarchy. Following the first information layer, the second information layer may be arranged. The second information layer may be configured to load each specification file referenced in the first information layer. In other words, all of the specification files indicated in the first information layer as necessary information for building the assessment environment may be collected in the second information layer.

The second information layer may be arranged and stored in the application database and created in a temporary storage location to load one or more specification files referenced in the first information layer. After obtaining results of the system assessment, the second information layer may be dissolved. Accordingly, creating duplicated specification files among different system assessments may be avoided. Additionally or alternatively, the second information layer may be stored in the general and/or external database, in which the plurality of specification files are collected. The second information layer may be stored at the same or different position as the first information layer.

In an example, the method further comprises loading at least one data set of at least one specification file loaded in the second information layer in a third information layer of the assessment. Following the second information layer, the third information layer may be arranged information hierarchy. The third information layer may be configured to load one or more data sets of at least one specification file loaded in the second information layer. Preferably, the third information layer may be configured to load all data sets consisting each specification file loaded in the second information layer. Accordingly, the application tool for performing the system assessment may obtain full information necessary to build the assessment environment.

The third information layer may be also arranged in the general and/or external database and created in a temporary storage location to load at least one, preferably entire data sets associated with all specification files loaded in the second information layer. After obtaining results of the system assessment, the third information layer may be also dissolved. Accordingly, creating duplicated specification files among different system assessments may be avoided. Additionally or alternatively, the third information layer may be stored in the application database. The third information layer may be stored at the same or different position as the first and/or the second information layer.

In an example, the method further comprises version controlling at least one specification file referenced in the first information layer. In an example, the method further comprises version controlling at least one specification file loaded in the second information layer. In an example, the method further comprises version controlling at least one data set loaded in the third information layer.

The term "version controlling" may be understood in that changes of data stored in a database may be controlled and tracked. Each newly generated version may be saved in an archive with a number or letter code. For instance, if a first change is made in an individual data set, the changed data set may be identified by "ver. 2".

Accordingly, any change of an initial or present data set of a specification file may initiate to create a new version of said data set, which may cause, in turn, a version control of the specification file and subsequently the work order, i.e. first information layer. By updating and creating new version(s) of each of the first, second and third information layers, an evolution of information, normally reflected by its filename, may be easily tracked by the history itself and the hierarchy of specifications. Hence, traceability of the changes in the data sets and/or the specification files may be improved. As a result, the evolution of the simulation environments can be tracked uniquely.

Even though conventional version control systems may be able to store and display these changes, it may remain difficult to reuse only some parts of the dataset, which is updated, since it is difficult to comprehend dependencies between different changes, and see which parts affect which aspect of the analysis.

Further, since the information provided to the application tool may not form the monolith data set according to the present disclosure, the version controlling of the data sets and/or the specification files may be facilitated without producing duplication thereof.

In an example, classifying each specification file comprises labeling each specification file by providing a suffix to a name of the specification file, the suffix being selected to describe the specification of the specification file. Generally, an engineer may collect information relating a task to be performed and arrange the information in logical chunks of data, which may form the specification files. In other words, each specification file may be classified with respect to the specification to be applied in a real physical test environment.

Thus, each specification file may be identified by its filename and additionally a suffix provided at the filename. The suffix may be selected such that the filename including the suffix may refer to a sort of a specification. In other words, each filename of an individual specification file may comprise a suffix describing the specification and a code indicating the version control. Hence, selecting and/or referencing at least one classified specification file necessary to build a simulation environment in a first information layer of the assessment may be facilitated, which may also ensure a high quality of an automated execution of the system assessment.

In an example, the plurality of specification files comprises at least one of test rig specification, report specification, experiment specification, test sequence specification, test system specification, parameter specification, measurement specification, actuation specification and use case specification.

Thus, a specification file comprising a test rig specification may be identified by a suffix "_rig", a specification file comprising an experiment specification may be identified by a suffix "_exp", a specification file comprising a parameter specification may be identified by a suffix "_par", a specification file comprising an actuation specification may be identified by a suffix "_act", etc.

In an example, the method further comprises applying a multi-disciplinary design optimization process as an application tool for building the assessment environment and executing the system assessment. The application tool may be capable to interpret the first information layer, collect the specification files necessary to build the assessment environment and finally build the assessment environment due to the standardized set of specification files. In other words, the application tool may be able to perform an automated execution of the system assessment.

The computer-implemented method of the present disclosure may be implemented in a software package application tool, which may contain codes to build the assessment environment and execute the system assessments, as well as to interface databases with specifications, models, code packages, simulation tools, etc. The application tool may be developed in Python, Perl, Ruby or the like.

In an example, the method further comprises receiving an input for building the assessment environment only from the first information layer. The application tool for performing the system assessment may have only the access to the first information layer referencing one or more specification files necessary to build the assessment environment. In other words, the work order, i.e. the first information layer may be the sole input to the application tool and act as a "single source of truth". Accordingly, the application tool may not need to access entire monolithic data set for configuring and executing a simulation, which may improve process efficiency and reliability.

In an example, the method further comprises storing the first information layer in the database. By storing the respective first information layer for each system assessment, it may be easily reloaded in the application tool. Further, the second information layer and the third information layer associated with the first information layer may be quickly rearranged. Thus, a particular simulation environment can be easily rebuilt and the system assessment can be easily re-executed, which allows easy launch of work, simple hand-off, and free-up time for simulation experts.

In an example, the method further comprises creating a new first information layer for a forthcoming assessment. After accomplishing a system assessment, a next system assessment may be prepared and executed. Therefore, the new first information layer may be generated defining a new assessment environment. The new first information layer may be also the sole input to the application tool.

In an example, the method further comprises referencing at least one specification file in the new first information layer, which was referenced during previous assessment.

When referencing at least one classified specification file necessary to build the new assessment environment, one or more specification files, which were already referenced in the previous first information layer during the previous system assessment, may be re-referenced in the new first information layer.

Since each specification files are standardized by means of the suffix and the version control and the previous first information layer indicates specification files without storing their contents, re-referencing one or more specification files in the new first information layer may be available. Accordingly, the new first information layer may reference a mixture of a new specification files, which were not referenced in the previous system assessment, and reused specification files, which were referenced in the previous system assessment.

According to the present disclosure, a computer program element for performing a system assessment is presented. The computer program element is adapted to perform the method steps as described above, when being executed by a processing element.

According to the present disclosure, one or more computer storage media is presented. The computer storage media is encoded with instructions, that when executed by a computer, cause the computer to perform the operations of the respective method as described above.

The storage media may comprise internal to a computing device, such as a computer's SSD, or a removable device such as an external HDD or universal serial bus (USB) flash drive. There are also other types of storage media, including magnetic tape, compact discs (CDs) and non-volatile memory (NVM) cards.

According to the present disclosure, a computer system is presented. The system comprises one or more computer storage media as described above and a computer for executing the instructions.

It should be noted that the above examples may be combined with each other irrespective of the aspect involved. Accordingly, the method may be combined with structural features and, likewise, the system may be combined with features described above with regard to the method.

These and other examples of the present disclosure will become apparent from and elucidated with reference to the embodiments described hereinafter.

BRIEF DESCRIPTION OF DRAWINGS

Examples according to the present disclosure will be described in the following with reference to the following drawings.

FIG. 1 shows schematically and exemplarily an example of a flowchart of a computer-implemented method for performing a system assessment according to the present disclosure.

DESCRIPTION OF EXAMPLES

Figure 2:
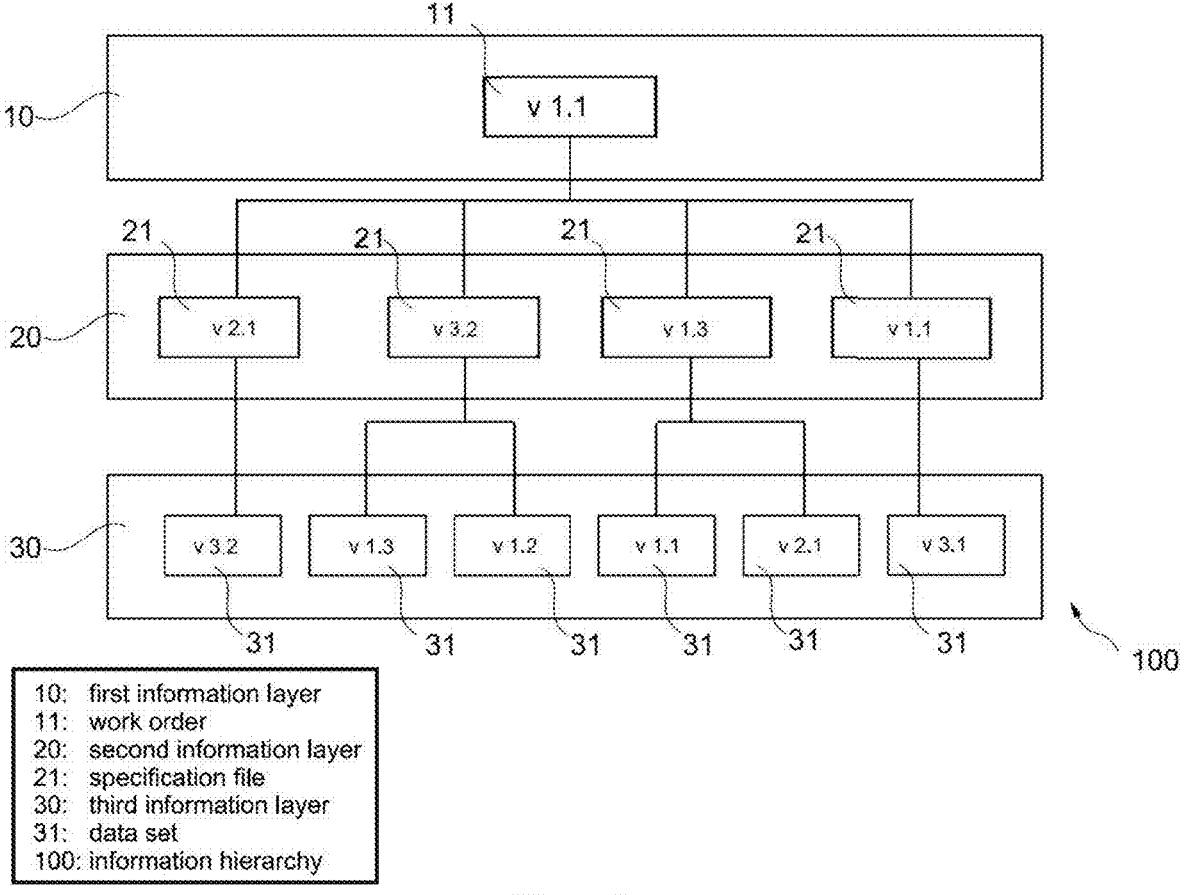
FIG. 2 shows schematically and exemplarily an example of an information layer structure according to the present disclosure.

FIG. 1 shows a computer-implemented method for performing a system assessment according to the present disclosure. The method may be adapted to understand or predict a technical object or a technical system based on information defining the system to be analyzed and its environment. The method may be performed not necessarily in this order.

Each element in FIG. 1 indicates:

S1 collecting a plurality of specification files in a database, wherein the specification files comprising at least one of test rig specification, report specification, experiment specification, test sequence specification, test system specification, parameter specification, measurement specification, actuation specification and use case specification;

S101 classifying each specification file based on a specification to be applied in a test environment;

S102 labeling each specification file by providing a suffix to a name of the specification file, the suffix being selected to describe the specification of the specification file;

S2 applying an application tool containing codes for building the assessment environment and executing the system assessment;

S3 creating a first information layer;

S4 referencing at least one classified specification file necessary to build an assessment environment in a first information layer of the simulation;

S401 version controlling at least one specification file referenced in the first information layer;

S5 loading at least one specification file referenced in the first information layer in a second information layer of the system assessment;

S501 version controlling at least one specification file loaded in the second information layer;

S6 loading at least one data set of at least one specification file loaded in the second information layer in a third information layer of the assessment;

S601 version controlling at least one data set loaded in the third information layer;

S7 receiving an input for building the simulation environment only from the first information layer;

S8 building the assessment environment based on the specification file referenced in the first information layer;

S9 executing the system assessment;

S10 creating a report;

S11 storing the first information layer in the database;

S12 creating a new first information layer for a forthcoming system assessment;

S13 referencing at least one specification file in the new first information layer, which was referenced during previous system assessment.

Accordingly, standardized sets of specification files each defining a particular aspect of analysis may be generated, which are generic and its logical partitioning may be based on a physical test environment. This aspect-oriented approach enables a reuse and sharing of relevant specifications across domains and environments. In addition, the information provided by the specifications may be compatible with different simulation tools and serve as a common information source.

As shown in FIG. 2, the information provided to perform the system assessment may be constituted in a hierarchy 100 comprising several information layers. At a top of the information hierarchy 100, a first information layer 10 is arranged. The first information layer 10 of the information hierarchy 100 may be configured to provide a work order 11 comprising a package of one or more specification files 21.

Following the first information layer 10, a second information layer 20 is arranged. The second information layer 20 is configured to load each specification file 21 referenced in the first information layer 10. In other words, all of the specification files 21 indicated in the first information layer 10 as necessary information for building the assessment environment are collected in the second information layer 20.

At the bottom of the information hierarchy 100, a third information layer 30 is arranged. The third information layer 30 is configured to load one or more data sets 31 of at least one specification file 21 loaded in the second information layer 20. Accordingly, the application tool for performing the system assessment may obtain full information necessary to build the assessment environment. Additionally, the information hierarchy 100 may comprise further information layers providing information to the third information layer 30.

Since all of the first, second and third information layers 10, 20, 30 are configured to be version controlled individually, an evolution of the simulation environments can be tracked uniquely. In particular, by updating and creating new version(s) of each of the first, second and third information layers, the evolution of information, normally reflected by its filename, may be easily tracked by the history itself and the hierarchy of specifications. As a result, traceability of the changes in the data sets and/or the specification files can be improved.

It has to be noted that examples of the disclosure are described with reference to different subject matters. In particular, some examples are described with reference to method type claims whereas other examples are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and description, such illustration and description are to be considered illustrative or exemplary and not restrictive. The disclosure is not limited to the disclosed examples. Other variations to the disclosed examples can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A computer-implemented method for performing a system assessment comprising:

classifying each of a plurality of specification files based on how a specification associated with each of the plurality of specification files would be applied in a physical test environment of a simulation corresponding to the system assessment, the specification files comprising at least one of test rig specification and actuation specification;

referencing at least one classified specification file necessary to build an assessment environment in a first information layer of an assessment definition, wherein the first information layer provides a work order for building the assessment environment and comprises no data set associated with the at least one classified specification file;

loading the at least one classified specification file referenced in the first information layer in a second information layer of the assessment definition; and building the assessment environment based on the at least one classified specification file referenced in the first information layer and loaded in the second information layer of the assessment definition.

2. The method according to claim 1, further comprising loading at least one data set of the at least one classified specification file loaded in the second information layer in a third information layer of the assessment definition.

3. The method according to claim 2, further comprising, version controlling at least one data set loaded in the third information layer.

4. The method according to claim 2, further comprising, storing the second information layer in a database.

5. The method according to claim 1, further comprising, version controlling the at least one classified specification file referenced in the first information layer.

6. The method according to claim 1, further comprising, version controlling the at least one classified specification file loaded in the second information layer.

7. The method according to claim 1, classifying each of the plurality of specification files comprising labeling each of the plurality of specification files by providing a suffix to a name of the specification file, the suffix being selected to describe the specification of the specification file.

8. The method according to claim 1, the specification files further comprising at least one of report specification, experiment specification, test sequence specification, test system specification, parameter specification, measurement specification and use case specification.

9. The method according to claim 1, further comprising, applying a multi-disciplinary design optimization process as an application tool for building the assessment environment and executing the system assessment.

10. The method according to claim 1, further comprising, receiving an input for building the assessment environment only from the first information layer.

11. The method according to claim 1, further comprising, storing the first information layer in a database.

12. The method according to claim 1, further comprising, creating a new first information layer for a forthcoming system assessment.

13. The method according to claim 12, further comprising, referencing at least one specification file in the new first information layer, which was referenced during previous system assessment.

14. The method according to claim 1, further comprising:

after obtaining results of the system assessment, dissolving the second information layer.

15. An application tool for performing a system assessment comprising:

a processing element, being adapted to perform the method steps of:

classifying each of a plurality of specification files based on how a specification associated with each of the plurality of specification files would be applied in a physical test environment of a simulation corresponding to the system assessment, the specification files comprising at least one of test rig specification and actuation specification;

referencing at least one classified specification file necessary to build an assessment environment in a first information layer of an assessment definition, wherein the first information layer provides a work order for building the assessment environment and comprises no data set associated with the at least one classified specification file;

loading the at least one classified specification file referenced in the first information layer in a second information layer of the assessment definition; and building the assessment environment based on the at least one classified specification file referenced in the first information layer and loaded in the second information layer of the assessment definition.

16. The application tool according to claim 15, the processing element, being further adapted to perform the method step of:

after obtaining results of the system assessment, dissolving the second information layer.

17. A non-transitory computer storage media encoded with instructions that, when executed by one or more computers, cause the one or more computers to perform the operations of the respective method of:

classifying each of a plurality of specification files based on how a specification associated with each of the plurality of specification files would be applied in a physical test environment of a simulation corresponding to the system assessment, the specification files comprising at least one of test rig specification and actuation specification;

referencing at least one classified specification file necessary to build an assessment environment in a first information layer of an assessment definition, wherein the first information layer provides a work order for building the assessment environment and comprises no data set associated with the at least one classified specification file;

loading the at least one classified specification file referenced in the first information layer in a second information layer of the assessment definition; and building the assessment environment based on the at least one classified specification file referenced in the first information layer and loaded in the second information layer of the assessment definition.

18. A computer system comprising the non-transitory computer storage media of claim 17 and one or more computers for executing the instructions.

19. The computer storage media according to claim 17, the respective method further comprising:

after obtaining results of the system assessment, dissolving the second information layer.

* * * * *